(12) United States Patent
Mazzillo et al.

(10) Patent No.: US 11,670,732 B2
(45) Date of Patent: Jun. 6, 2023

(54) HIGH SENSITIVITY SEMICONDUCTOR DEVICE FOR DETECTING FLUID CHEMICAL SPECIES AND RELATED MANUFACTURING METHOD

(71) Applicant: STMICROELECTRONICS S.R.L., Agrate Brianza (IT)

(72) Inventors: Massimo Cataldo Mazzillo, Corato (IT); Giovanni Condorelli, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 17/464,299

(22) Filed: Sep. 1, 2021

(65) Prior Publication Data
US 2021/0399156 A1     Dec. 23, 2021

Related U.S. Application Data

(62) Division of application No. 16/386,184, filed on Apr. 16, 2019, now Pat. No. 11,139,411.

(30) Foreign Application Priority Data

Apr. 17, 2018    (IT) ........................ 102018000004620

(51) Int. Cl.
    *H01L 31/107*      (2006.01)
    *H01L 31/18*       (2006.01)
    (Continued)

(52) U.S. Cl.
    CPC ......... *H01L 31/1075* (2013.01); *G01N 21/75* (2013.01); *H01L 27/14643* (2013.01); *H01L 31/18* (2013.01)

(58) Field of Classification Search
    CPC ............ H01L 31/02161; H01L 31/107; G01N 2027/222
See application file for complete search history.

(56) References Cited

U.S. PATENT DOCUMENTS 5,032,729 A     7/1991    Charpak
5,434,442 A     7/1995    Lesk et al.
(Continued)

FOREIGN PATENT DOCUMENTS

EP      2255177 A2    12/2010
EP      3051280 A1     8/2016
(Continued)

OTHER PUBLICATIONS

Alphasense Application Note, "p-type Metal Oxide Sensor Overview and Interface Circuit," AAN 601-03, Alphasense Ltd., Jan. 2019, 4 pages.
(Continued)

*Primary Examiner* — Julio J Maldonado
*Assistant Examiner* — Stanetta D Isaac
(74) *Attorney, Agent, or Firm* — Seed IP Law Group LLP

(57) ABSTRACT

A device for detecting a chemical species, including a Geiger-mode avalanche diode, which includes a body of semiconductor material delimited by a front surface. The semiconductor body includes: a cathode region having a first type of conductivity, which forms the front surface; and an anode region having a second type of conductivity, which extends in the cathode region starting from the front surface. The detection device further includes: a sensitive structure arranged on the anode region and including at least one sensitive region, which has an electrical permittivity that depends upon the concentration of the chemical species; and a resistive region, arranged on the sensitive structure and electrically coupled to the anode region.

19 Claims, 15 Drawing Sheets

(51) Int. Cl.
*G01N 21/75* (2006.01)
*H01L 27/146* (2006.01)

(56) References Cited

U.S. PATENT DOCUMENTS

| | | | |
|---|---|---|---|
| 5,759,367 | A | 6/1998 | Matsuura et al. |
| 9,728,667 | B1 | 8/2017 | Johnson et al. |
| 9,799,757 | B2 | 10/2017 | Gridelet et al. |
| 9,952,094 | B2 | 4/2018 | Mazzillo et al. |
| 10,209,125 | B2 | 2/2019 | Mazzillo et al. |
| 10,797,196 | B2 | 10/2020 | Mazzillo et al. |
| 2006/0118903 | A1 | 6/2006 | Cahen et al. |
| 2008/0156993 | A1 | 7/2008 | Weinberg et al. |
| 2009/0114819 | A1 | 5/2009 | Yamanaka et al. |
| 2009/0184317 | A1 | 7/2009 | Sanfilippo et al. |
| 2010/0065744 | A1 | 3/2010 | Ouvrier-Buffet |
| 2010/0102242 | A1 | 4/2010 | Burr et al. |
| 2011/0241149 | A1 | 10/2011 | Mazzillo et al. |
| 2012/0139074 | A1 | 6/2012 | Abe |
| 2012/0153423 | A1 | 6/2012 | Lee |
| 2014/0231951 | A1 | 8/2014 | Yoon et al. |
| 2014/0234981 | A1 | 8/2014 | Zarkesh-Ha et al. |
| 2016/0216227 | A1 | 7/2016 | Boni |
| 2016/0282259 | A1 | 9/2016 | Kolb et al. |
| 2017/0314989 | A1 | 11/2017 | Mazzillo et al. |
| 2018/0033895 | A1 | 2/2018 | Mazzillo et al. |
| 2019/0319155 | A1 | 10/2019 | Mazzillo et al. |
| 2019/0319159 | A1 | 10/2019 | Mazzillo et al. |

FOREIGN PATENT DOCUMENTS

| | | |
|---|---|---|
| JP | 7221341 A | 8/1995 |
| JP | 882612 A | 3/1996 |
| JP | 8330558 A | 12/1996 |
| JP | 3349012 B2 | 11/2002 |
| JP | 2009258000 A | 11/2009 |
| JP | 2014132241 A | 7/2014 |
| KR | 10-1763865 B1 | 8/2017 |

OTHER PUBLICATIONS

Das et al., "Design and fabrication of low power polysilicon sources," Solid-State Electronics 43:12399-1244, 1999.

Figaro, "Non-Dispersive Infra-Red (NDIR) CO2 Sensor," published online 2018, downloaded on May 23, 2019 from https://www.figaro.co.jp/en/product/feature/cdm7160.html, 6 pages.

"Flame Tracker* Flame Tracker Improves Performance and Availability of Your Gas Turbine," GE Measurement & Control, 2015.

Fox et al., "MEMS and Sensors: Environment and Health Sensors in Mobile Devices," IHS Technology Report, 2017, 95 pages.

Hamamatsu Photonics K. K., "Mini-spectrometer [Micro series] C12666MA" product specifications datasheet, Catalog No. KACC1216E10, Jan. 2019, 11 pages.

"High Performance Low Cost Flame Detection," Spectrex INC. SharpEye™ 20/20M "Mini" Flame Detection Series, 8 pages, 2014.

Korotcenkov, "Metal oxides for solid-state gas sensors: What determines our choice?," Materials Science and Engineering B 139:1-23, 2007.

Laskovski (ed), Biomedical Engineering, Trends in Electronics, InTech, London, UK, 2011, Chapter 16, Gao et al., "Integrated High-Resolution Multi-Channel Time-to-Digital Converters (TDCs) for PET Imaging," pp. 295-316 (24 pages.).

Laconte et al. (ed), Micromachined Thin-Film Sensors For SOI-CMOS Co-Integration, Springer, Dordrecht, The Netherlands, 2006, 291 pages.

McConnell et al., "Thermal Conductivity of Doped Polysilicon Layers," Journal of Microelectromechanical Systems 10(3):360-369, 2001.

"Model FL4000H Multi-Spectral Infrared Flame Detector," General Monitors by MSA, 72 pages.

"Quick Detection of Flame from Distance, Compact UV Sensor with High Sensitivity and Wide Directivity Suitable for Flame Detectors and Fire Alarms," Hamamatsu Flame Sensor UVTRON® R2868, 2 pages, 2014.

Sensirion, "Datasheet SGPC3 Sensirion Gas Platform," product specifications datasheet, Version 0.91, Feb. 2018, 16 pages.

Soundarrajan, "Achieving the Potential of Nano Gas Sensors," published online Sep. 1, 2006, downloaded from https://www.sensorsmag.com/components/achieving-potential-nano-gas-sensors, 4 pages.

Tisa et al., "Electronics for single photon avalanche diode arrays," Sensors and Actuators A 140:113-122, 2007.

"UV Flame Detector X2200," Detector Electronics Corporation, 2 pages, 2014.

"UVIR Flame Detector X5200," Detector Electronics Corporation, 2 pages, 2014.

Yan et al., "Demonstration of the First 4F-SiC Avalanche Photodiodes," Solid State Electronics (44) pp. 341-346, 2000.

Zappa et al., "Principles and features of single-photon avalanche diode arrays," Sensors and Actuators A 140:103-112, 2007.

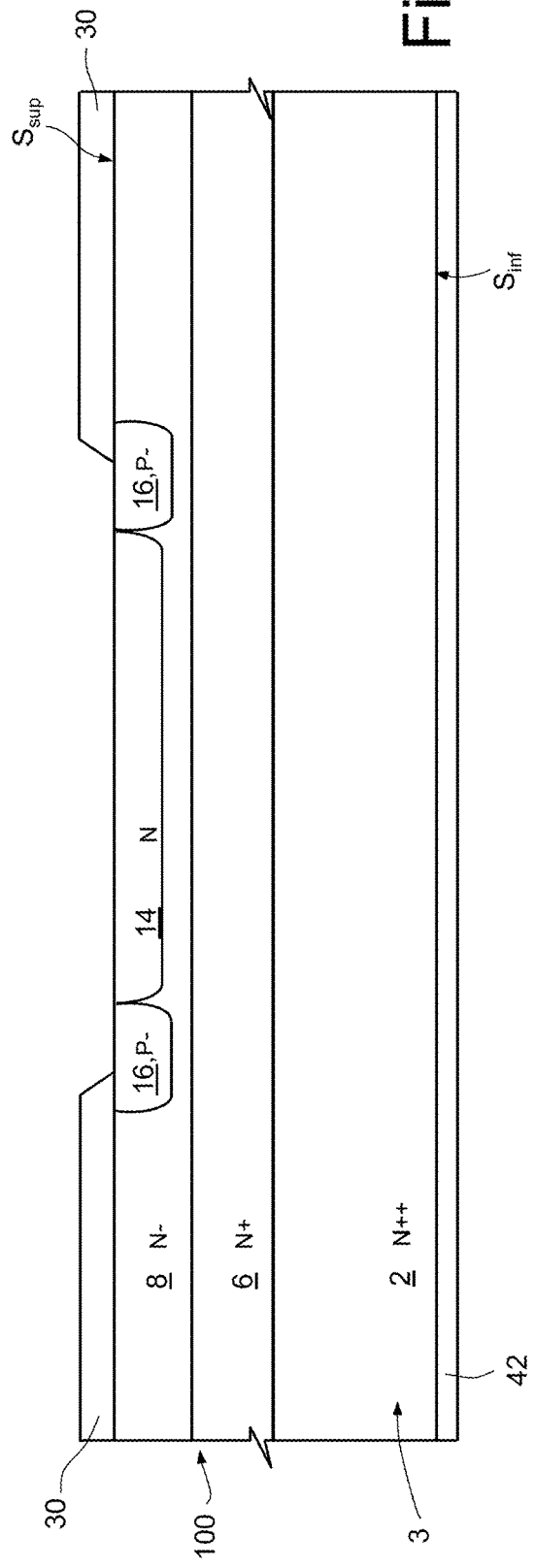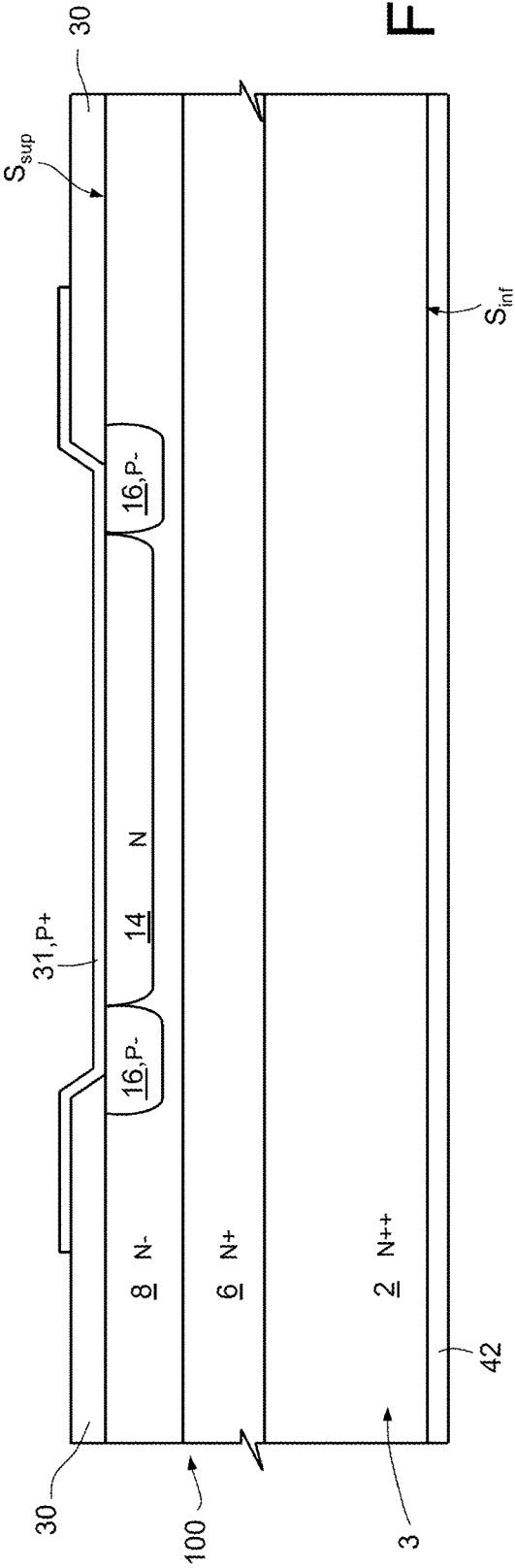

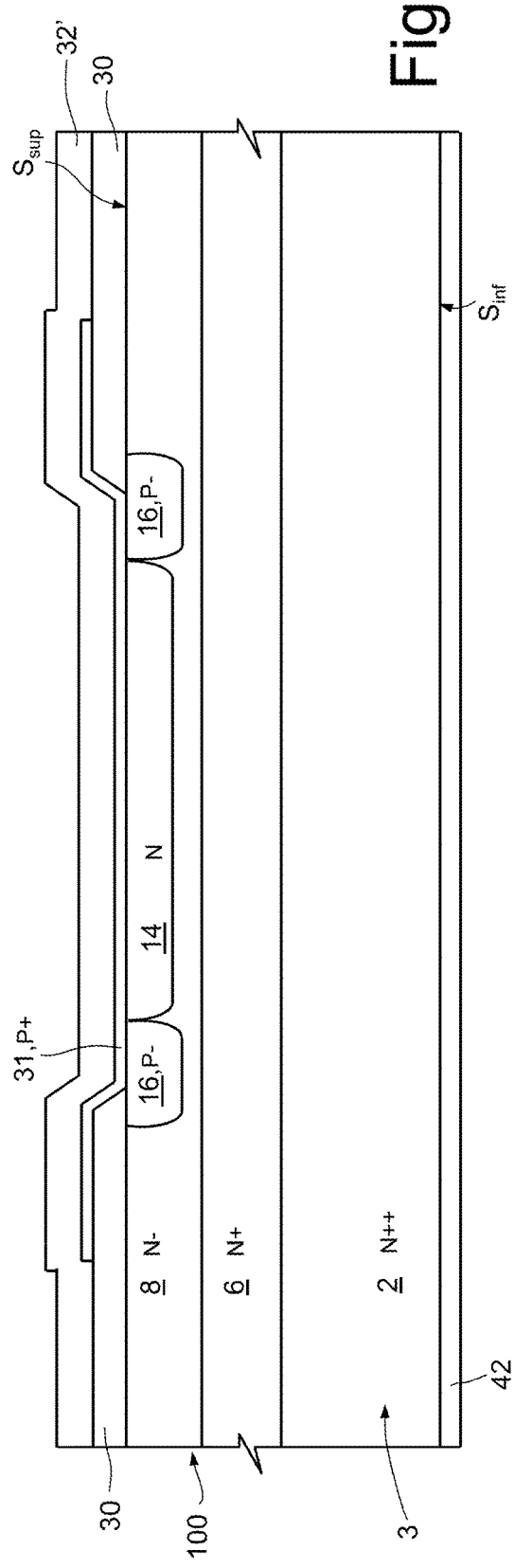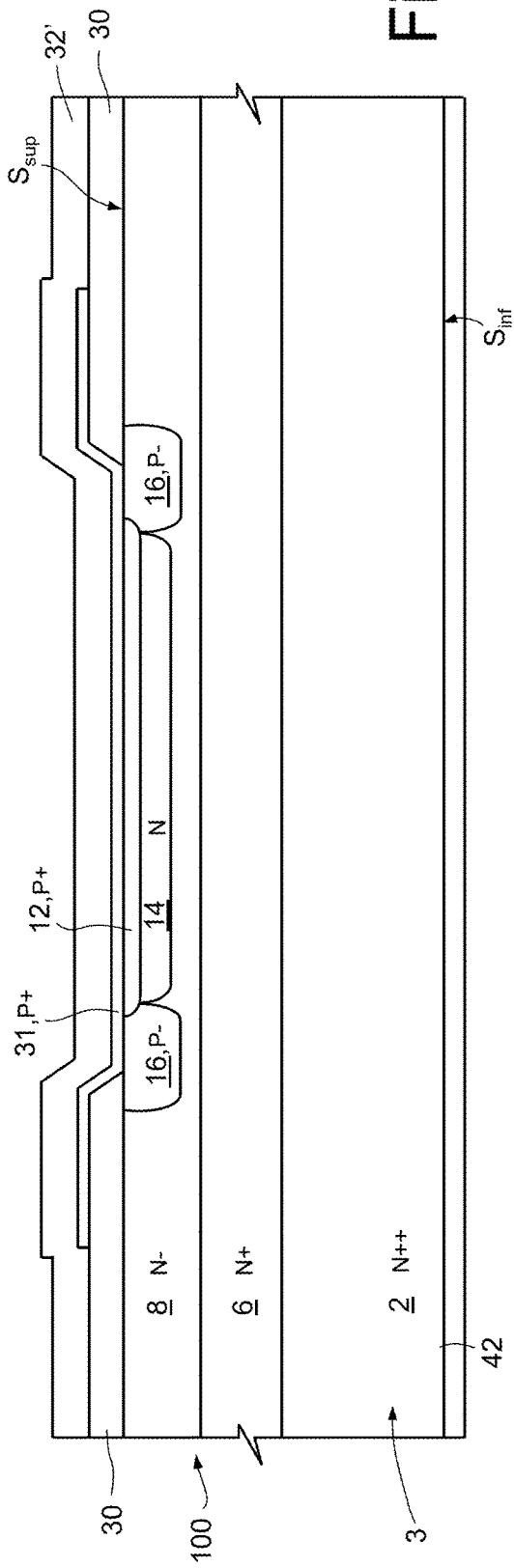

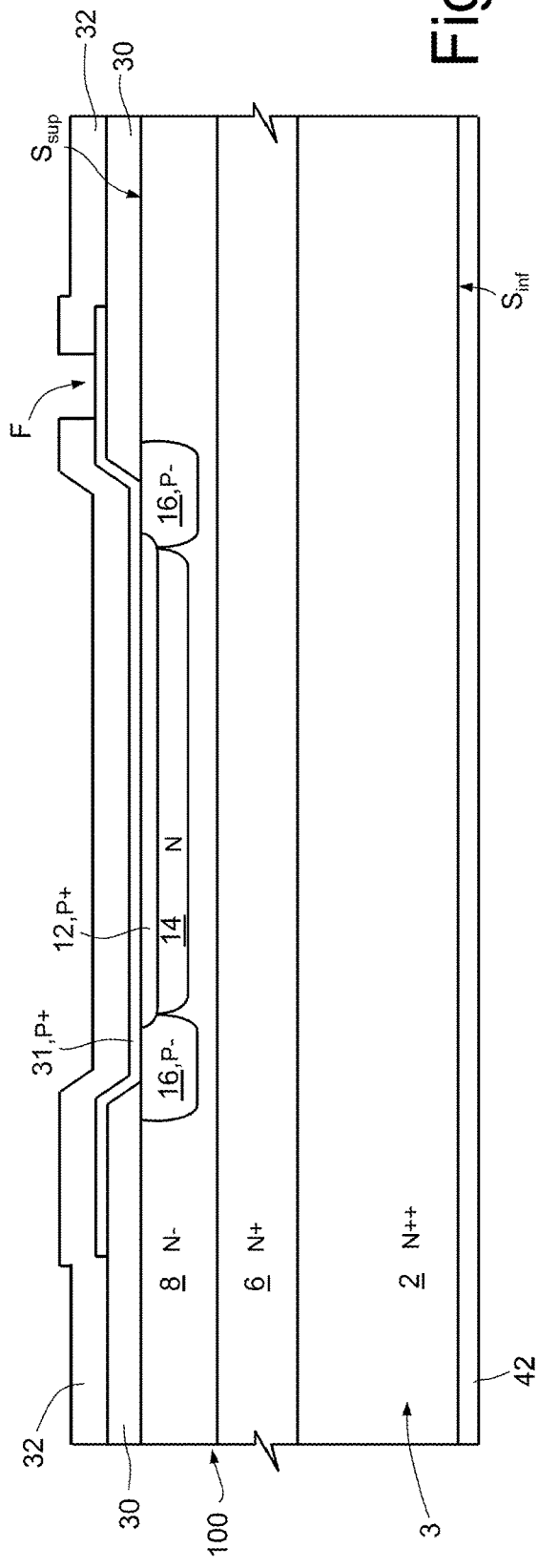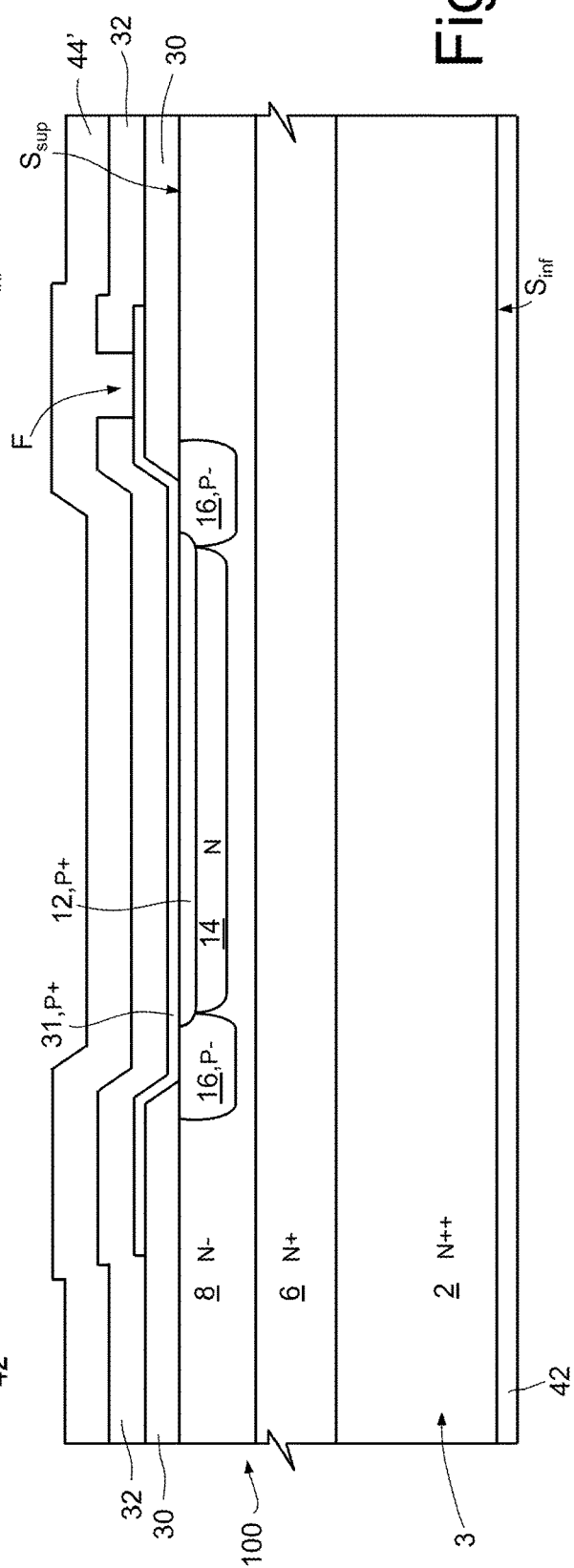

HIGH SENSITIVITY SEMICONDUCTOR DEVICE FOR DETECTING FLUID CHEMICAL SPECIES AND RELATED MANUFACTURING METHOD

BACKGROUND

Technical Field

The present disclosure relates to a high sensitivity semiconductor device for detecting fluid chemical species, as well as to the related manufacturing method.

Description of the Related Art

As is known, in various fields of application there is today a desire to detect one or more chemical species, in particular in the gaseous phase, and hence determine the corresponding concentrations of such chemical species. For instance, in the field of the automotive industry, there is a desire to determine the concentrations, within an exhaust gas, of chemical species that are generated in the course of the thermal reactions that occur within an engine. In this connection, it is known that, following upon a reaction of combustion that takes place between the fuel and the air, water ($H_2O$) and pollutant chemical species, such as carbon dioxide ($CO_2$), carbon monoxide (CO), sulphur oxides ($SO_x$), nitrogen oxides ($NO_x$), hydrocarbons (HC), and particulate matter (PM), are generated. In turn, nitrogen oxides include nitrogen monoxide (NO), nitrogen dioxide ($NO_2$), and dinitrogen monoxide ($N_2O$).

Once again by way of example, there is today a desire to have available sensors that enable detection of volatile organic compounds (VOCs), which are highly pollutant, in order to detect the quality of the air. In this connection, volatile organic compounds comprise, among other things, the so-called aromatic polycyclic hydrocarbons (APHs), the latter being notoriously dangerous for human health.

Irrespective of the field of application, and hence of the particular chemical species that are to be measured, various detection methods have been developed, which broadly speaking may be divided into: i) methods based upon detection of the variations of an electrical quantity of a sensitive element, following upon interaction between the sensitive element and the chemical species under examination; and ii) methods based upon detection of variations of quantities of a non-electrical type, such as acoustic quantities, optical quantities, etc.

Considering merely sensors that are based upon the variation of an electrical characteristic of a sensitive element thereof, they are characterized by low costs and by a certain simplicity of construction; however, they are likewise characterized by a not particularly high sensitivity, as well as, at times, by relatively long response times. In this connection, in general by "response time" is meant the time that elapses between the instant when the chemical species under examination reaches a threshold level and a subsequent instant, when the sensor detects that the threshold level has been reached.

BRIEF SUMMARY

One or more embodiments of the present disclosure provide a semiconductor device for detecting fluid chemical species that will solve at least in part the drawbacks of the prior art.

According to the present disclosure, a semiconductor device includes:
a body of semiconductor material delimited by a front surface;
a Geiger-mode avalanche diode, including:
a cathode region of a first type of conductivity formed in the body and extending from the front surface; and
an anode region of a second type of conductivity, which extends in the cathode region starting from the front surface;
a sensitive structure arranged on the anode region and including a sensitive region, said sensitive region having an electrical permittivity that depends upon a concentration of said chemical species; and
a resistive region arranged on the sensitive structure and electrically coupled to the anode region.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 11-20 are schematic cross-sectional views of a detection device, during successive steps of a manufacturing method.

DETAILED DESCRIPTION

The present semiconductor device is based upon the principle of operation of Geiger-mode avalanche photodiodes (GMAPs), also known as single-photon avalanche diodes (SPADs), in so far as they are able, at least theoretically, to ensure detection of individual photons.

In detail, it is known that a SPAD comprises a junction made of semiconductor material, which has a breakdown voltage $V_B$ and is biased, in use, at a reverse-biasing voltage $V_A$ higher in modulus than the breakdown voltage $V_B$. In this way, the junction presents a particularly extensive depleted region, present in which is a non-negligible electrical field. Hence, generation of a single electron-hole pair, caused by absorption within the depleted region of a photon incident on the SPAD, may be sufficient for triggering an ionization process. This ionization process in turn causes an avalanche multiplication of the carriers, with gains of around $10^6$, and consequent generation in short times (hundreds of picoseconds) of the so-called avalanche current, or more precisely of a pulse of the avalanche current.

The avalanche current can be collected by means of an external circuitry connected to the junction and represents a signal generated by the SPAD, also referred to as "output current". In practice, for each photon absorbed, a pulse of the output current of the SPAD is generated.

The fact that the reverse-biasing voltage $V_A$ is higher, in modulus, than the breakdown voltage $V_B$ causes the avalanche-ionization process, once triggered, to be self-sustaining. Consequently, once the avalanche-ionization process has been triggered, the SPAD is no longer able to detect photons, with the consequence that, in the absence of appropriate remedies, the SPAD manages to detect arrival of a first photon, but not arrival of subsequent photons. To be able to detect also the subsequent photons, it is necessary to quench the avalanche current generated within the SPAD, thus arresting the avalanche-ionization process, and in particular lowering, for a period of time known as "hold-off time", the effective voltage $V_e$ across the junction, so as to inhibit the ionization process. For this purpose, there is known the use of so-called quenching circuits, which may be of an active or passive type. Then, the reverse-biasing voltage $V_A$ is restored in order to enable detection of a subsequent photon.

This having been said, the present applicant has noted how it is possible to modify the structure of a SPAD so as to achieve the possibility of modulating the shape of the time plot of the pulses of the avalanche current as a function of the concentration of one or more chemical species under examination.

Figure 1:
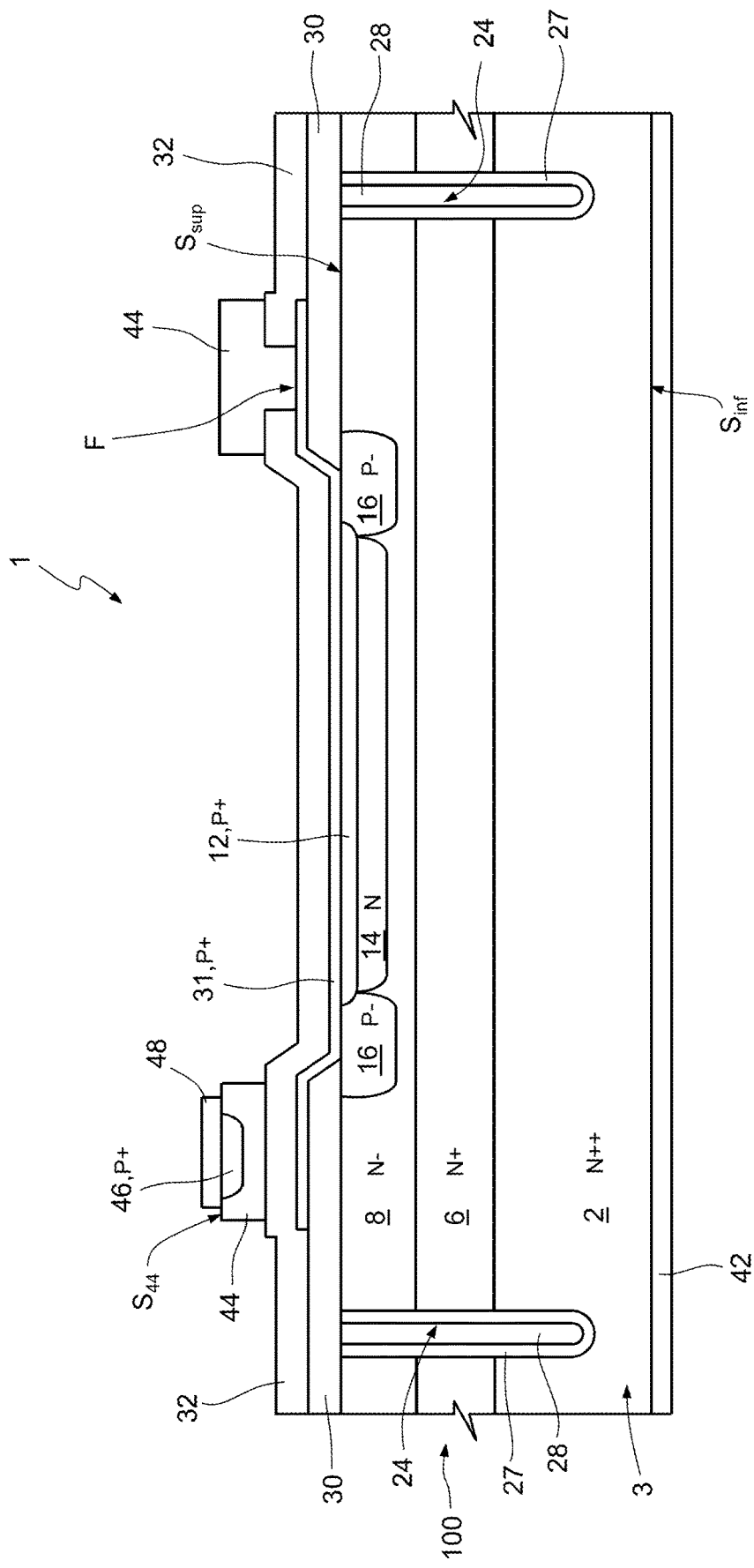
FIGS. 1, 7, 8, 9, and 10 are schematic cross-sectional views of embodiments of the present detection device.
Figure 2:
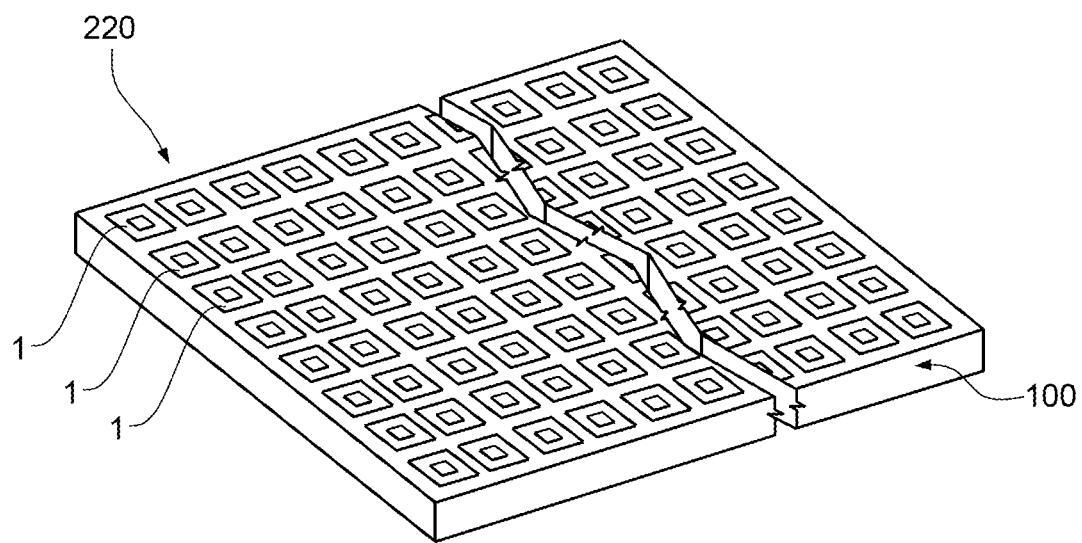
FIG. 2 is a schematic perspective view of an array of detection devices.

In greater detail, FIG. 1 shows a detection device 1, which is integrated in a die 100 of semiconductor material. As illustrated in FIG. 2, the detection device 1 may form part of an array 220 of detection devices that are the same as one another, all designated by 1.

In detail, the detection device 1 comprises a semiconductor body 3, which is made, for example, of silicon and in turn comprises a substrate 2, delimited by a bottom surface $S_{inf}$. Moreover, the detection device 1 includes a first epitaxial layer 6 and a second epitaxial layer 8. In FIG. 1, the thicknesses of the substrate 2 and of the first and second epitaxial layers 6, 8 are not in scale, as neither are the thicknesses of the other regions, described hereinafter.

The substrate 2 is of an N++ type, has a thickness of, for example, between 300 μm and 500 μm, and has a doping level of, for example, between $1 \cdot 10^{19}$ cm$^{-3}$ and $1 \cdot 10^{20}$ cm$^{-3}$.

The first epitaxial layer 6 is of an N+ type, has a thickness of, for example, between 4 μm and 8 μm and overlies, in direct contact, the substrate 2. Moreover, the first epitaxial layer 6 has a doping level of, for example, between $1 \cdot 10^{16}$ cm$^{-3}$ and $5 \cdot 10^{16}$ cm$^{-3}$.

The second epitaxial layer 8 is of an N− type, has a thickness of, for example, between 3 μm and 5 μm and overlies the first epitaxial layer 6, with which it is in direct contact. Moreover, the second epitaxial layer 8 has a doping level of, for example, between $1 \cdot 10^{14}$ cm$^{-3}$ and $3 \cdot 10^{14}$ cm$^{-3}$. Moreover, the second epitaxial layer 8 forms a top surface $S_{sup}$, which delimits the semiconductor body 3.

An anode region 12, of a P+ type, which has, in top plan view, a circular or polygonal (for example, quadrangular) shape, gives out onto the top surface $S_{sup}$ and extends in the second epitaxial layer 8. In particular, the anode region 12 has a thickness of, for example, between 0.05 μm and 0.4 μm; moreover, the anode region 12 has a doping level of, for example, between $1 \cdot 10^{18}$ cm$^{-3}$ and $1 \cdot 10^{19}$ cm$^{-3}$.

An enriched region 14, of an N type, extends in the second epitaxial layer 8, underneath, and in direct contact with, the anode region 12. In top plan view, the enriched region 14 has a circular or polygonal (for example, quadrangular) shape; moreover, the enriched region 14 has a thickness of, for example, 1 μm and a doping level of, for example, between $1 \cdot 10^{16}$ cm$^{-3}$ and $5 \cdot 10^{16}$ cm$^{-3}$.

For practical purposes, the anode region 12 and the enriched region 14 form a first PN junction, designed to receive photons and generate the avalanche current. The enriched region 14 and the second epitaxial layer 8 have, instead, the purpose of confining a high electrical field in the proximity of the first PN junction, reducing the breakdown voltage $V_B$ of the junction itself.

A guard ring 16 having a circular shape, of a P− type and with a doping level of between $1 \cdot 10^{16}$ cm$^{-3}$ and $3 \cdot 10^{16}$ cm$^{-3}$, extends in the second epitaxial layer 8; in particular, the guard ring 16 gives out onto the top surface $S_{sup}$ and is arranged on the outside of the anode region 12, with which it is in direct contact. Moreover, the guard ring 16 has a thickness of, for example, between 1 μm and 3 μm.

The guard ring 16 forms a second PN junction with the second epitaxial layer 8 so as to prevent edge breakdown of the anode region 12.

The detection device 1 further comprises a lateral-insulation region 24, which is arranged on the outside of the guard ring 16 and extends, starting from the top surface $S_{sup}$, within the semiconductor body 3.

The lateral-insulation region 24 has a circular or polygonal shape in top plan view; moreover, the lateral-insulation region 24 extends in the semiconductor body 3 so as to traverse the first and second epitaxial layers 6, 8, as well as part of the substrate 2. As mentioned previously, the lateral-insulation region 24 surrounds the guard ring 16 at a distance.

In turn, the lateral-insulation region 24 comprises a channel-stopper region 27 arranged further out, formed by dielectric material (for example, oxide) and arranged in direct contact with the semiconductor body 3, as well as a barrier region 28, made, for example, of tungsten, which is surrounded by the channel-stopper region 27, with which it is in direct contact.

The detection device 1 further comprises a first dielectric region 30, which extends over the top surface $S_{sup}$, is made, for example, of thermal oxide and has a thickness of, for example, 0.8 μm. In particular, the first dielectric region 30 has a hollow shape so as to define a cavity that leaves the anode region 12 exposed. In other words, whereas the anode region 12 gives out onto a central portion of the top surface $S_{sup}$, the first dielectric region 30 extends over a peripheral portion of the top surface $S_{sup}$. Moreover, the first dielectric region 30 extends partially over the guard ring 16, with which it is in direct contact.

The detection device 1 further comprises a region 31, referred to hereinafter as the intermediate region 31.

In detail, the intermediate region 31 is made, for example, of polysilicon, is of a P+ type, has a doping level of between $1 \cdot 10^{20}$ cm$^{-3}$ and $3 \cdot 10^{20}$ cm$^{-3}$ and has a thickness of, for example, between 50 nm and 100 nm. Moreover, the intermediate region 31 extends, in direct contact, on the first dielectric region 30 and on the anode region 12, as well as on the guard-ring portion 16 left exposed by the first dielectric region 30.

In greater detail, and without this implying any loss of generality, the intermediate region 31 extends over a central portion of the first dielectric region 30, which defines the aforementioned cavity, whereas it leaves a peripheral portion of the first dielectric region 30 exposed.

The detection device 1 further comprises a second dielectric region 32, which extends, in direct contact, on the intermediate region 31 and on the peripheral portion of the first dielectric region 30, left exposed by the intermediate region 31. Moreover, the second dielectric region 32 has a thickness of, for example, between 50 nm and 500 nm.

In detail, assuming that the detection device 1 is configured to detect the concentration of a given chemical species (for example, a volatile organic compound) that comes into contact with the second dielectric region 32, the second dielectric region 32 is made of any material that is able to exhibit a variation of its own electrical permittivity following upon interaction with the aforementioned chemical species. For instance, the second dielectric region 32 may be made of a material that exhibits a variation of its own electrical permittivity of at least 0.1%, following upon a variation of 50 ppm in the concentration of the chemical species to be detected.

In greater detail, the second dielectric region 32 may be made, for example, of an oxide of a metal material, such as: $TiO_2$, $V_2O_5$, $WO_3$, $SnO_2$, $ZnO$ and $Fe_2O_3$. These materials are characterized by high values of electrical permittivity, with consequent increase in the sensitivity of the detection device 1; moreover, such materials exhibit low coefficients of absorption in the visible and in the ultraviolet, as well as refractive indices of around 2, i.e., comprised between the refractive index of air and that of silicon, a fact that renders them suited to forming anti-reflection coatings of the semiconductor body 3.

Alternatively, and once again by way of example, the second dielectric region 32 may be made, for example, of a non-conductive polymer, or else of a carbon-based nanomaterial (for example, carbon or graphene nanotubes, possibly functionalized), in which case it may exhibit a certain conductivity. Alternatively, the second dielectric region 32 may be formed by a polymer/s-metal compound (i.e., a material comprising a polymeric structure with metal inclusions or a metal structure interspersed by polymer), such as: CFx-Pd, MOF (Metal-Organic Framework)-5 and $Cu_3(btc)_2$.

In general, moreover, the second dielectric region 32 can be functionalized according to the chemical species to be detected.

The detection device 1 further comprises a cathode metallization 42, made of metal material, which extends underneath the bottom surface $S_{inf}$ of the substrate 2, with which it is in direct contact. Although not illustrated, the cathode metallization 42 may be formed by a corresponding multilayer structure of metal material.

The detection device 1 further comprises a resistive region 44, which extends over the second dielectric region 32, as well as, in part, through the second dielectric region 32, so as to contact a portion of the intermediate region 31 that extends on the first dielectric region 30. The resistive region 44 is delimited at the top by a surface $S_{44}$, referred to hereinafter as the resistor surface $S_{44}$.

In particular, the second dielectric region 32 defines a window F, which overlies the intermediate region 31; the resistive region 44 extends through the window F so as to contact, in fact, the intermediate region 31.

Figure 3:
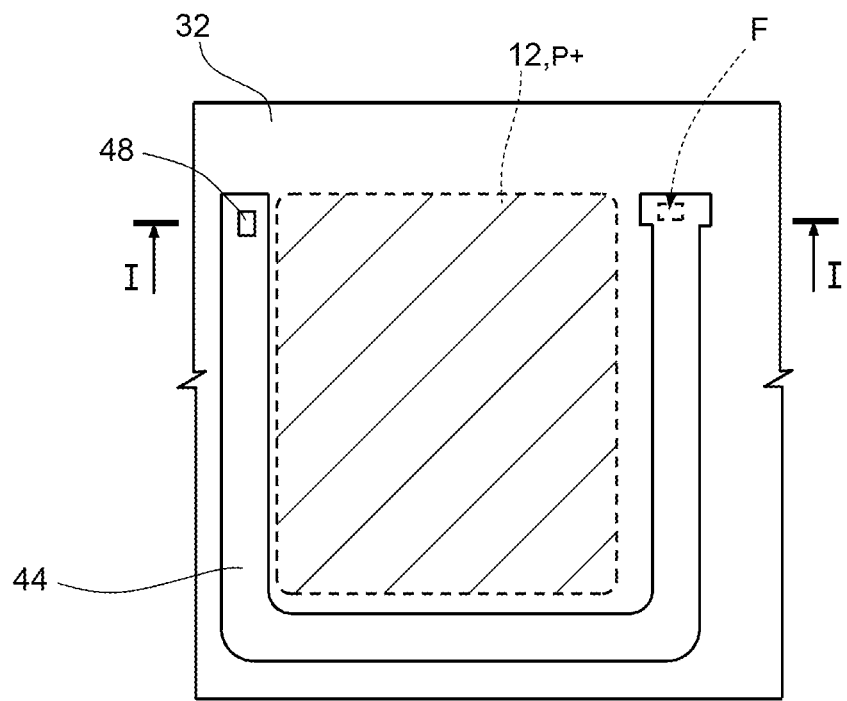
FIG. 3 is a schematic top plan view with portions removed of the embodiment illustrated in FIG. 1.

In top plan view, the resistive region 44 has, for example, an elongated, approximately "C" shape, which surrounds, once again in top plan view, the anode region 12, as illustrated, for example in FIG. 3. For greater clarity, FIG. 3 shows only the anode region 12, the second dielectric region 32, the resistive region 44, a contact region 46, and a top metallization 48, described hereinafter. Once again without this implying any loss of generality, the window F has a quadrangular shape in top plan view.

In greater detail, the resistive region 44 is made, for example, of polysilicon of a P type with low doping (for example, of between $1 \cdot 10^{15}$ cm$^{-3}$ and $1 \cdot 10^{16}$ cm$^{-3}$). Moreover, the portion of resistive region 44 that extends outside the window F has a thickness of, for example, between 300 nm and 700 nm.

The contact region 46 extends in the resistive region 44, starting from the resistor surface $S_{44}$, at a distance from the second dielectric region 32. The contact region 46 is made, for example, of polysilicon of a P+ type, has a doping level of between $1 \cdot 10^{19}$ cm$^{-3}$ and $1 \cdot 10^{20}$ cm$^{-3}$, and has a thickness of, for example, between 0.05 µm and 0.3 µm.

The top metallization 48 is made, for example, of a multilayer structure (not illustrated in detail) of metal material and extends on the resistive region 44, in direct contact with the contact region 46, as well as with part of the resistive region 44. In addition, without this implying any loss of generality, the top metallization 48 has a quadrangular shape in top plan view and overlies entirely the contact region 46 (detail not shown). Moreover, in top plan view, the top metallization 48 and the window F are arranged in the proximity of the ends of the C shape of the resistive region 44.

For practical purposes, the enriched region 14, the substrate 2, and the first and second epitaxial layers 6, 8 form a cathode region. Moreover, the top metallization 48 functions as anode metallization. In addition, in the semiconductor body 3, the avalanche current flows substantially in a direction perpendicular to the top surface $S_{sup}$ and to the bottom surface Suf. Moreover, the resistive region 44 is connected in series to the anode region 12, and hence the avalanche current flows also through the resistive region 44.

The second dielectric region 32 functions as sensitive structure, which interacts chemically with the chemical species to be detected. Moreover, the second dielectric region 32 is interposed between the intermediate region 31, which is conductive, and the resistive region 44, which exhibits in any case a certain capacity of conduction. In particular, a secondary portion of the second dielectric region 32 is covered by the resistive region 44, whereas a main portion of the second dielectric region 32 is laterally staggered with respect to the resistive region 44, and is hence left exposed by the latter so as to be able to interact chemically with the chemical species. This main portion of the second dielectric region 32 overlies, inter alia, the anode region 12 at a distance.

In other words, the second dielectric region 32, the intermediate region 31, and the resistive region 44 form a sort of sensing capacitor, the plates of which, formed respectively by the intermediate region 31 and by the resistive region 44, locally contact one another, in an area corresponding to the window F. The variations of the electrical permittivity of the second dielectric region 32, caused by the interaction with the chemical species, bring about a variation in the capacitance of the sensing capacitor.

The resistive region 44 moreover acts as quenching resistor, which is electrically connected to the anode region 12 and is able to quench the avalanche current generated following upon absorption of a photon, as described in greater detail hereinafter.

Operatively, the top metallization 48 is set at a reverse-biasing voltage $V_A$ equal, in modulus, to the sum of the breakdown voltage $V_B$ of the junction present between the anode region 12 and the cathode region, plus a voltage $V_{OV}$, of, for example, −3 V. In the absence of the avalanche current, no current flows in the resistive region 44, which is hence all at one and the same voltage, equal to the reverse-biasing voltage $V_A$. Following upon triggering of the avalanche current, within the resistive region 44 a potential drop occurs on account of the flow of the avalanche current within the resistive region 44. In particular, whereas the portion of resistive region 44 that contacts the top metallization 48 remains at the reverse-biasing voltage $V_A$, the portion of resistive region 44 that contacts the intermediate region 31 is at a voltage approximately equal to the breakdown voltage $V_B$. Following upon quenching of the avalanche current, the resistive region 44 returns to having all one and the same voltage, equal to the reverse-biasing voltage $V_A$. In other words, the anode region 12 recharges to the reverse-biasing voltage $V_A$, with a timing that depends, not only upon the value of resistance of the resistive region 44, but also upon the capacitance of the sensing capacitor.

As regards, instead, the lateral-insulation region 24, it enables, by means of the barrier region 28, optical insulation of the detection device 1 from the other detection devices of the array 220. In particular, the barrier region 28 of the lateral-insulation region 24 enables reduction of instantaneous crosstalk. Moreover, the oxide present in the channel stopper 27 guarantees electrical insulation.

In use, turning-on of a detection device 1 does not alter, to a first approximation, biasing of the adjacent detection devices 1. In addition, within the substrate 2, the voltage drop due to the passage of the avalanche current is negligible, on account of the low resistivity of the substrate 2. Consequently, the array 220 forms a so-called silicon photomultiplier (SiPM), i.e., an array of SPADs (in the case in point, the detection devices 1), grown on one and the same substrate and provided with respective quenching resistors decoupled from and independent of one another. Moreover, the detection devices 1 are connected to one and the same voltage generator (not illustrated) so as to be biased at the aforementioned reverse-biasing voltage $V_A$. The avalanche currents generated within the detection devices 1 are multiplexed together so as to generate a signal at output from the SiPM, referred to hereinafter as "array signal". The array signal is equal to the summation of the output signals of the SPADs, which are formed by the avalanche currents. The array signal is hence proportional, to a first approximation, to the number of photons that impinge upon the array 220.

Figure 4A:
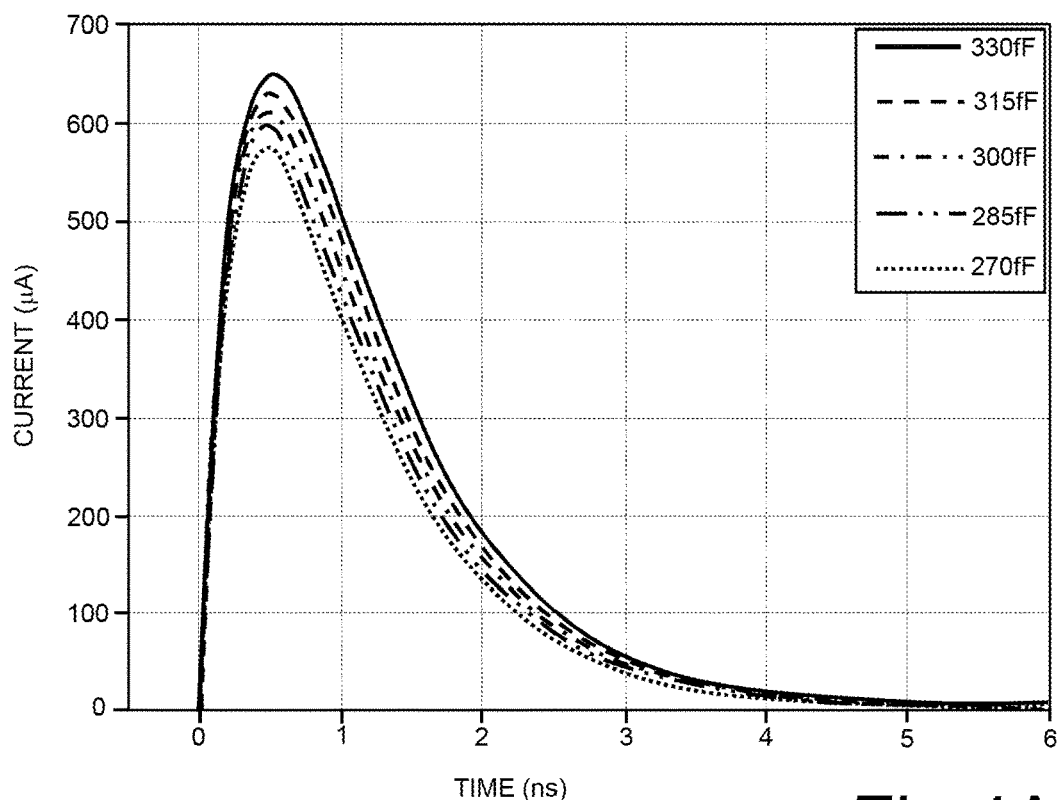
FIGS. 4A and 4B each show time plots of current pulses for different values of the capacitance of a sensing capacitor.

This having been said, FIG. 4A shows possible time plots of the array signal corresponding to different values of the capacitance of the aforementioned sensing capacitor.

Figure 4B:
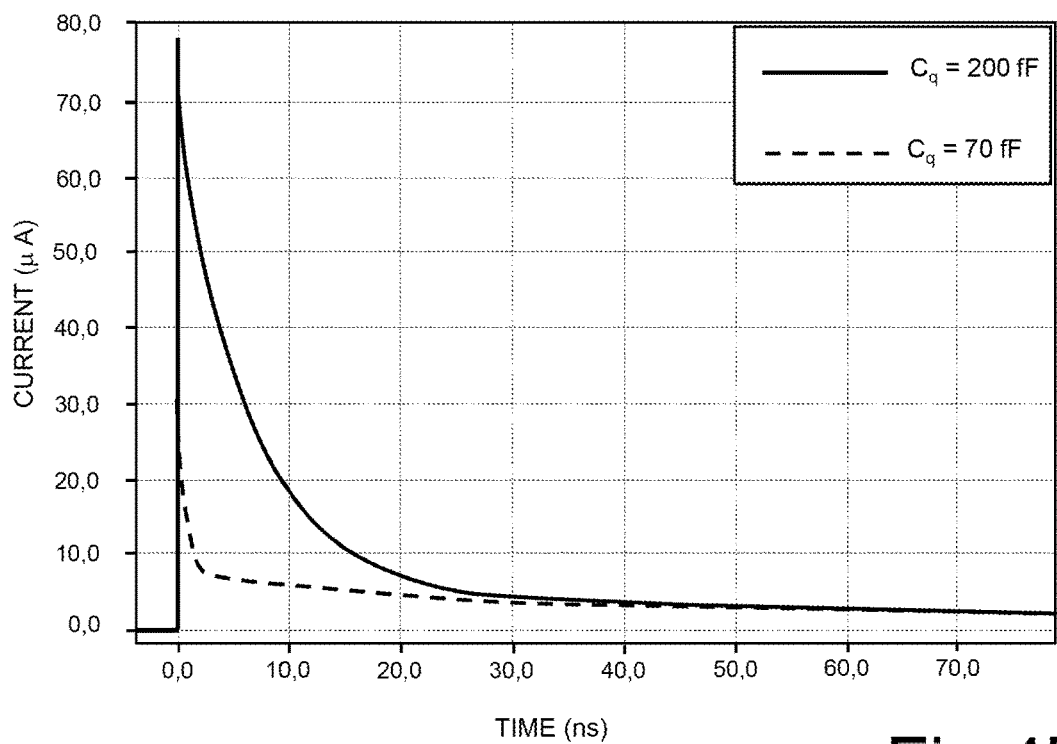

In particular, it may be noted how, as the value of capacitance of the sensing capacitor increases, and other conditions (for example, biasing) being equal, there is an increase in the peak value of the current pulse of the array signal, as well as an increase in the slope of the so-called rising portion of the pulse, which precedes occurrence of the peak. In addition, as is more clearly visible in FIG. 4B, as the value of capacitance of the sensing capacitor increases, there is an increase in the duration of the so-called quenching portion of the pulse, i.e., of the portion of the pulse immediately subsequent to the peak and having a decreasing exponential trend, that precedes the so-called recharging portion, which follows an approximately rectilinear pattern. The dependence of the duration of the quenching portion of the pulse upon the value of capacitance of the sensing capacitor is greater than the dependence of the slope of the rising portion of the pulse upon the same quantity.

In other words, modulation of the capacitance of the sensing capacitor enables modulation of the pattern of the array signal. In turn, as explained previously, the capacitance of the sensing capacitor depends upon the concentration of at least one chemical species (for example, in the gaseous state), which interacts with the detection device 1, and in particular with the second dielectric region 32. For this reason, the detection device 1 functions as electrical transducer of the concentration of the chemical species.

Figure 5:
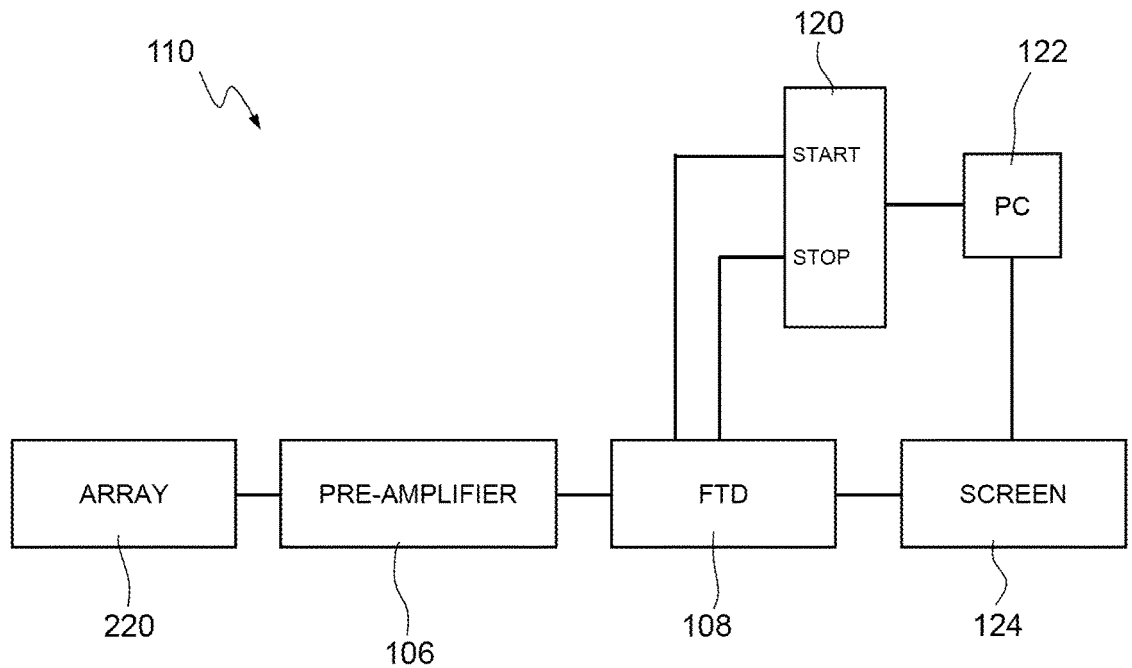
FIG. 5 shows a block diagram of a system for detecting chemical species.

In greater detail, it is possible to make use of the detection system 110 illustrated in FIG. 5, which comprises, in addition to the array 220, appropriately supplied by a corresponding power-supply stage (not illustrated), also a pre-amplifier 106 (optional), a fixed-threshold discriminator (FTD) 108, a time-to-amplitude converter (TAC) 120, a computer 122, and a screen 124.

The array 220 is electrically connected to the input of the pre-amplifier 106, the output of which is connected to the input of the fixed-threshold discriminator 108; a first output of the fixed-threshold discriminator 108 is connected to a first input terminal START of the time-to-amplitude converter 120, whereas a second output of the fixed-threshold discriminator 108 is connected to a second input terminal STOP of the time-to-amplitude converter 120, the output of which is connected to the computer 122, which in turn is connected to the screen 124.

In use, the pre-amplifier 106 amplifies the array signal, generating a pre-amplified signal. The fixed-threshold discriminator 108 generates, on its own first output, a first timing signal, indicating the instant when the current value of each pulse (in particular, the rising portion) of the pre-amplified signal exceeds a threshold value. Moreover, the fixed-threshold discriminator 108 generates, on its own second output, a second timing signal, indicating the instant when the current value of each pulse (in particular, of the quenching portion) of the pre-amplified signal drops below the threshold value.

As mentioned previously, the instant when the current value of each pulse of the pre-amplified signal exceeds the threshold value may indicate detection of a photon by the detection device 1. However, this aspect is irrelevant for the purposes of determination of the concentration of the chemical species under examination, as explained in detail hereinafter. In this connection, here it is anticipated that triggering of a current pulse can occur also independently of the presence of radiation. In other words, for the purposes of determination of the concentration it is irrelevant what type of event leads to triggering of the current pulses, which can hence be formed by so-called dark pulses. In what follows, for a generic current pulse of the pre-amplified signal reference is made to the first and second instants $t_1$, $t_2$ to indicate, respectively, the instant when the current exceeds the threshold value and the subsequent instant when the current drops below the threshold value.

Irrespective of the cause that has led to generation of a pulse of the array signal, it may be demonstrated that, given a current pulse of the array signal, dependence of the corresponding first instant $t_1$ upon the value of capacitance of the sensing capacitors is substantially negligible, given that it is in the region of 0.2 ps for a variation of capacitance of 1%; instead, dependence of the corresponding second instant $t_2$ upon the value of capacitance of the sensing capacitors is significant, given that it is approximately 10 ps for a variation of capacitance of 1%.

This having been said, the time-to-amplitude converter 120 generates, as a function of the first and second timing signals, a respective output signal, which represents, for each pulse of the array signal, the duration of the time interval that elapses between the corresponding first and second instants $t_1$, $t_2$, this duration being referred to hereinafter as the duration of the over-threshold interval. The computer 122 can thus calculate an estimate of the concentration of the chemical species that interacts with the second dielectric region 32 on the basis of the output signal.

Figure 6:
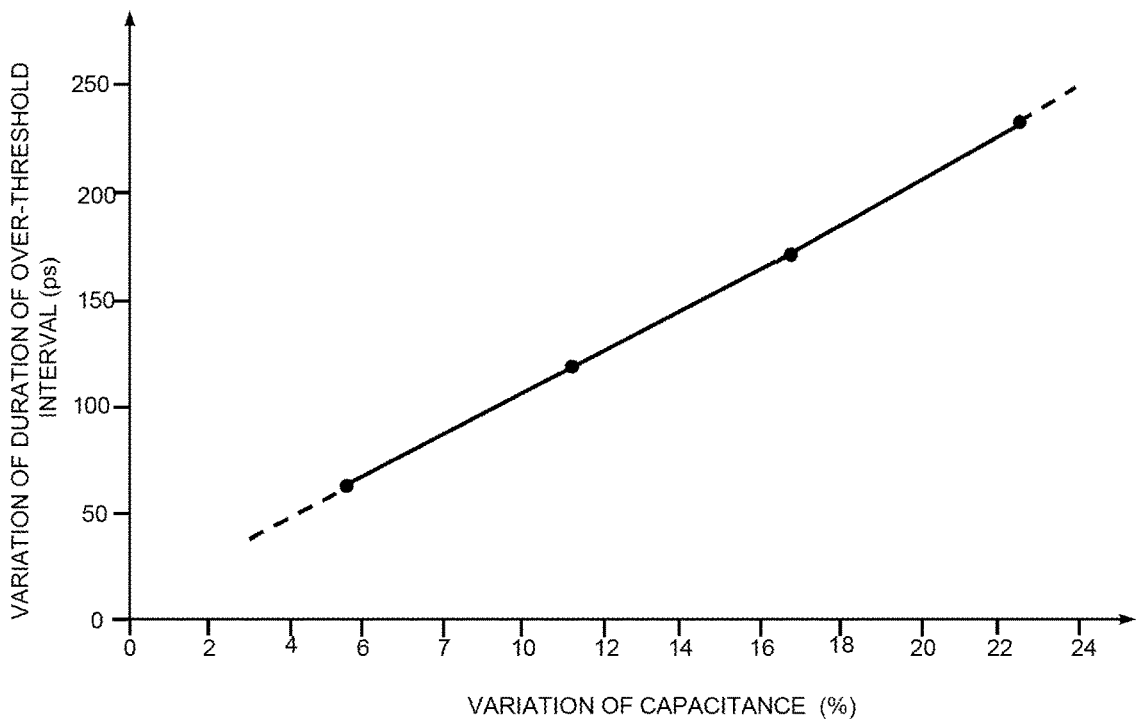
FIG. 6 shows an example of plot of the duration of a time interval, as a function of a variation of a value of capacitance.

In detail, the computer 122 can initially calculate a value of capacitance of the sensing capacitor, for example on the basis of a first calibration curve, an example of which is illustrated in FIG. 6. In detail, the first calibration curve is determined experimentally and is stored by the computer 122. Moreover, the first calibration curve correlates the variation of the duration of the over-threshold interval (measured with respect to a reference duration) with the variation of the capacitance of the sensing capacitor (measured with respect to a reference capacitance).

Next, the computer 122 can determine the concentration of the chemical species under examination, on the basis of the aforementioned variation of the capacitance and, for example, on the basis of a second calibration curve, which correlates the variation of concentration of the chemical species (measured with respect to a reference concentration) with the variation of the capacitance of the sensing capacitor. Also the second calibration curve can be determined experimentally. Alternatively, the computer 122 can determine the concentration of the chemical species under examination as a function of the duration of the over-threshold interval and of a third calibration curve determined experimentally, which correlates the concentration of the chemical species under examination and the duration of the over-threshold interval.

Finally, the computer 122 displays the value of concentration determined on the screen 124.

Figure 7:
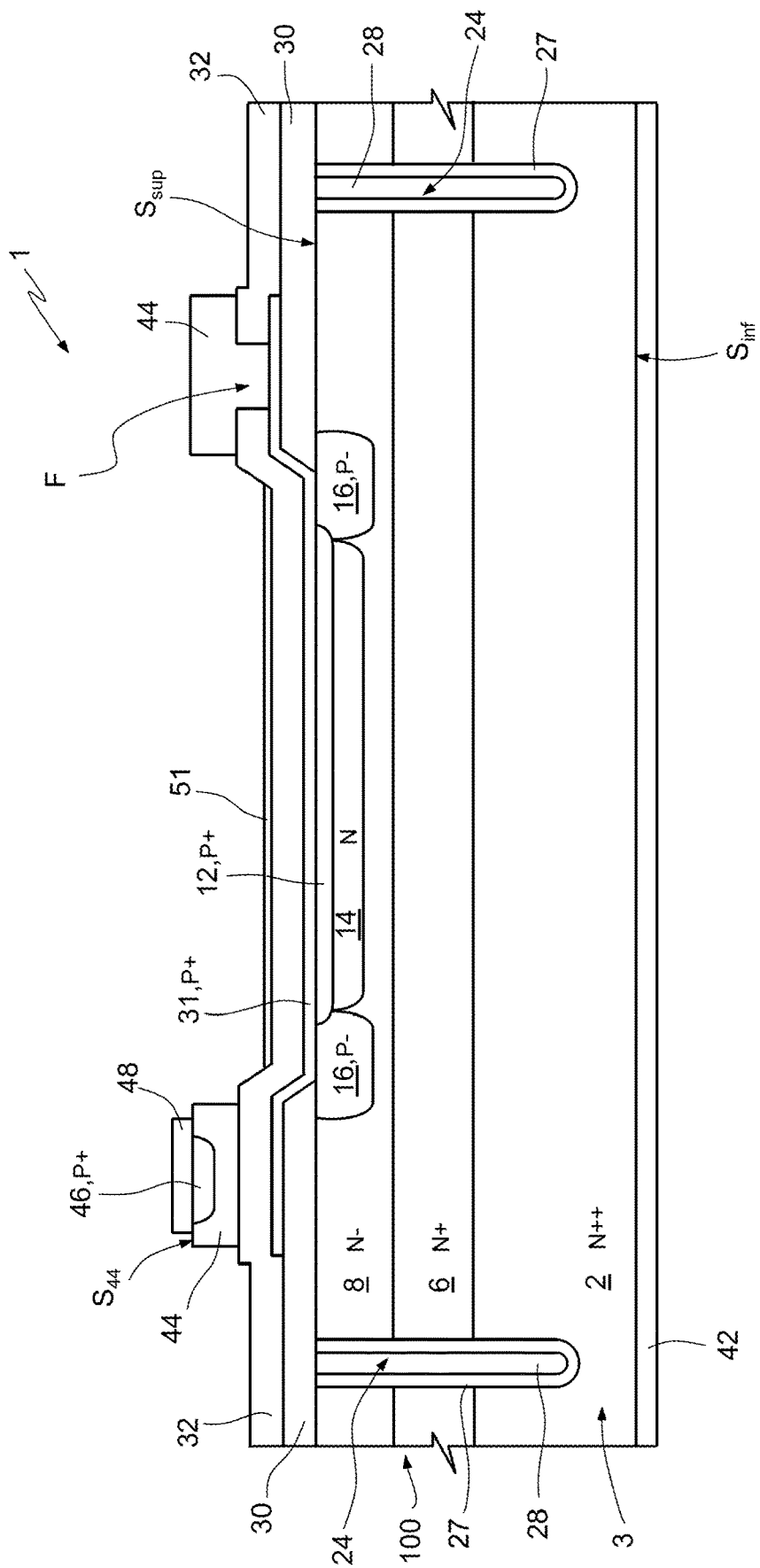

Various embodiments are moreover possible, as illustrated, for example in FIG. 7. In this case, extending over the second dielectric region 32, and in particular over the portion of the second dielectric region 32 that overlies, at a distance, the anode region 12, is an additional region 51, made of metal material (for example, palladium, tungsten, or iridium).

The additional region 51 has a thickness of, for example, between 50 nm and 500 nm and forms a sensitive structure with the second dielectric region 32.

Operatively, the additional region 51 functions as precursor, in order to increase the chemical interaction between the underlying second dielectric region 32 and the chemical species under examination, which can be represented, for example, by molecular hydrogen. Moreover, as explained previously, the fact that the additional region 51 can shield the radiation does not affect the behavior of the detection device 1.

Figure 8:
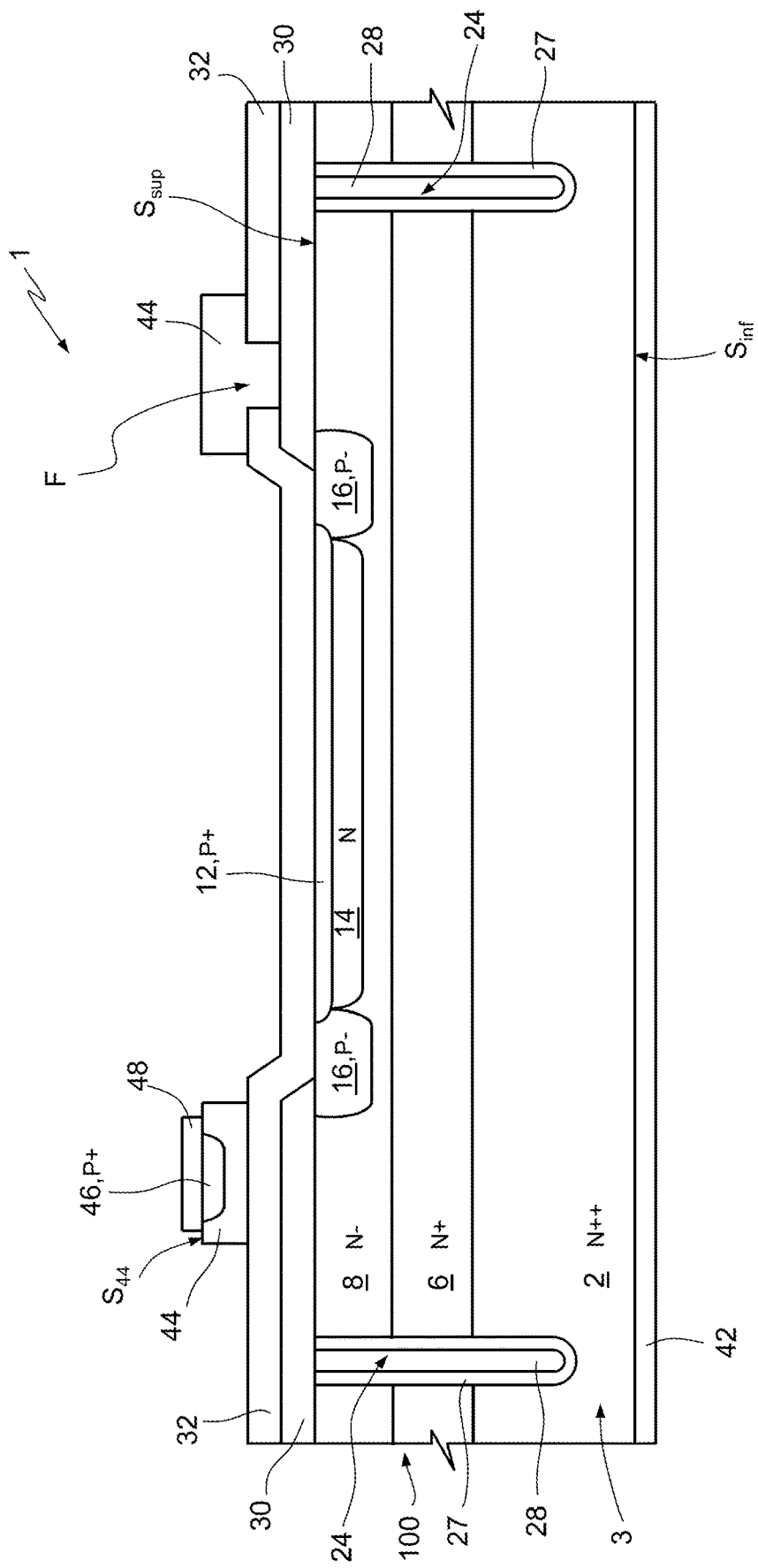

Albeit not illustrated, embodiments are moreover possible, which are the same as the embodiments illustrated in FIGS. 1 and 7, respectively, but in which the intermediate region 31 is absent, as illustrated, for example in FIG. 8. However, the presence of the intermediate region 31 enables reduction of the defectiveness of the anode region 12 since it avoids having to resort, during manufacture of the anode region 12, to processes of implantation.

Figure 9:
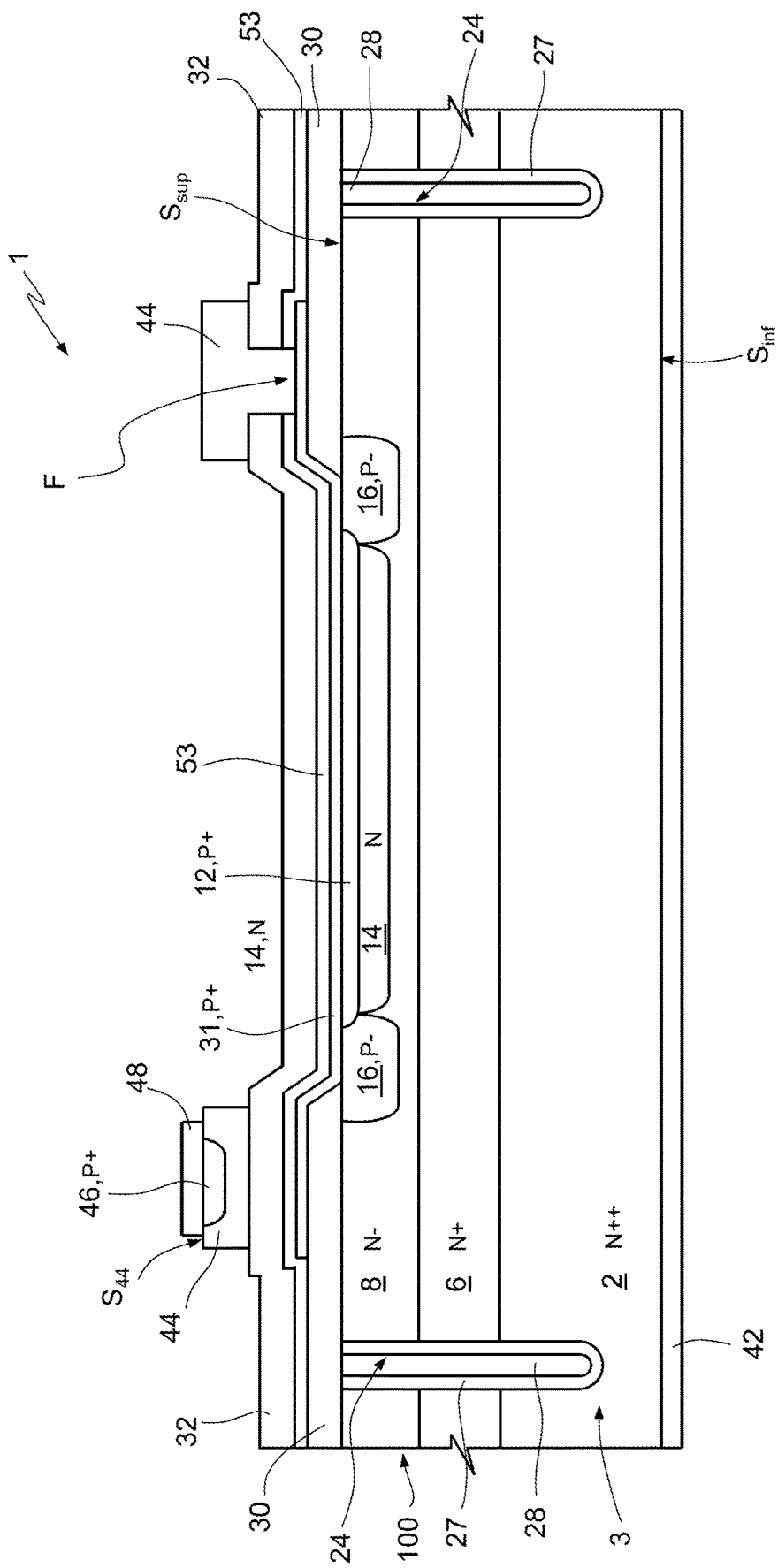

Embodiments are moreover possible, in which, between the second dielectric region 32 and, if present, the intermediate region 31, or else the anode region 12, if the intermediate region 31 is absent, a layer 53 is present, referred to in what follows as the supporting layer 53. An example of such embodiments, referred to the case where the intermediate region 31 is present, is illustrated in FIG. 9. The window F also extends through the supporting layer 53.

In detail, the supporting layer 53 is made, for example, of silicon oxide ($SiO_2$), or else of silicon nitride ($Si_3N_4$) and performs the function of reducing the surface defectiveness.

Albeit not illustrated, embodiments are moreover possible, which include both the additional region 51 and the supporting layer 53.

Figure 10:
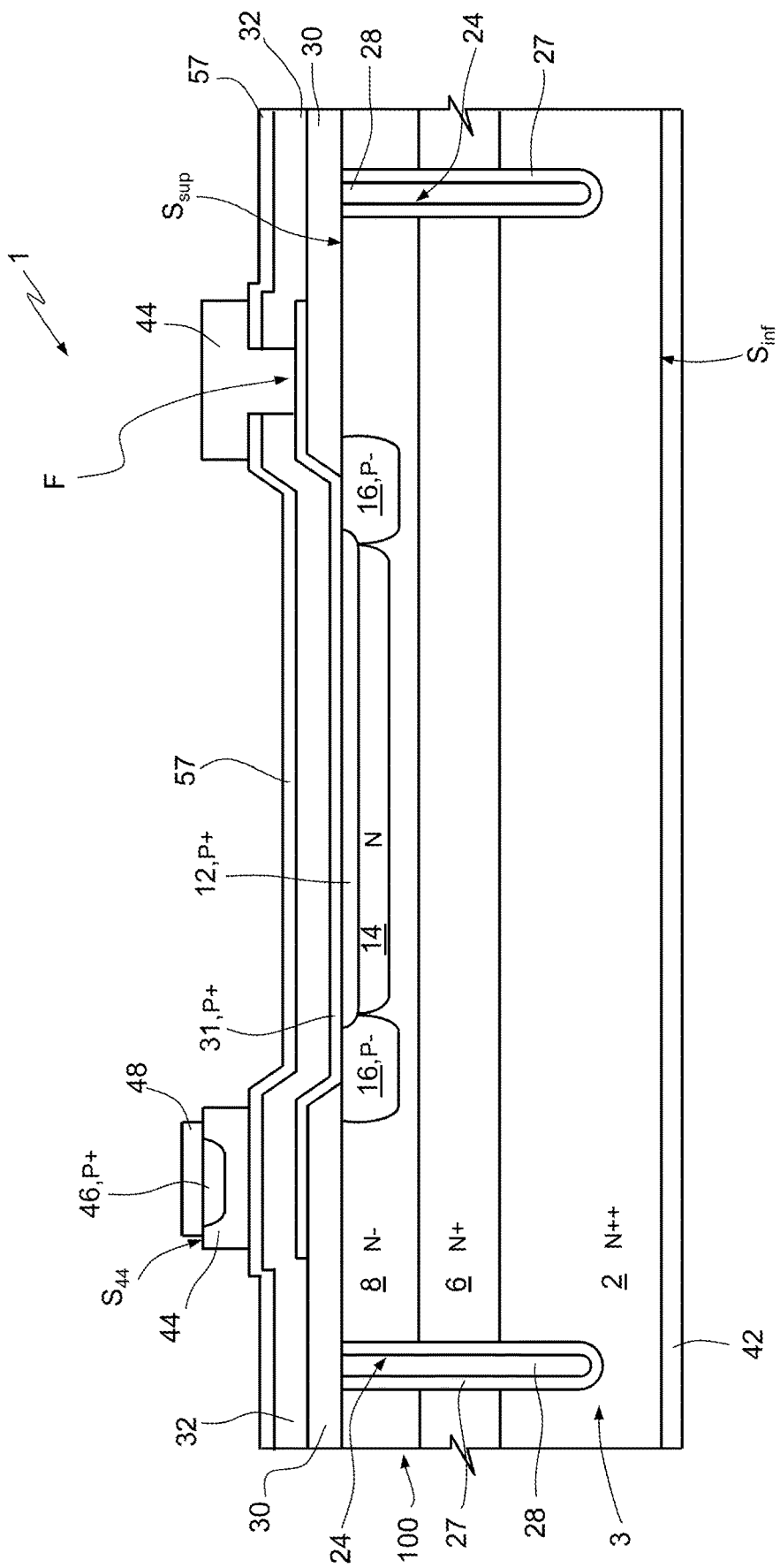

Embodiments are moreover possible present in which are one or more additional sensitive regions, as illustrated, for example, in FIG. 10. In particular, FIG. 10 shows a third dielectric region 57, which overlies, in direct contact, the second dielectric region 32. The window F also extends through the third dielectric region 57, which in top plan view can have the same shape as the underlying second dielectric region 32. Moreover, the resistive region 44 extends over the third dielectric region 57.

In detail, the third dielectric region 57 may be made of any one of the materials mentioned previously with reference to the second dielectric region 32, provided that it is different from the material that forms the second dielectric region 32. In this way, whereas the second dielectric region 32 exhibits a variation of the electrical permittivity as a function of the concentration of a first chemical species, the third dielectric region 57 exhibits a variation of the electrical permittivity as a function of the concentration of a second chemical species.

Albeit not illustrated, further embodiments are moreover possible, present in which more than two sensitive regions are present, stacked on top of one another, within a multilayer structure.

The present detection device 1 may be manufactured following the manufacturing method that is described hereinafter, with particular reference, purely by way of example, to an embodiment of the type illustrated in FIG. 1, but in which the lateral-insulation region 24 is absent.

As illustrated in FIG. 11, formed in a way in itself known are the substrate 2, the first and second epitaxial layers 6, 8, the enriched region 14, the guard ring 16, and the first dielectric region 30.

Next, as illustrated in FIG. 12, the intermediate region 31 is formed, for example by means of a process of deposition of a polysilicon layer doped in situ and a subsequent photolithographic process.

Then, as illustrated in FIG. 13, formed by deposition is a layer 32', referred to hereinafter as the first process layer 32'. The first process layer 32' is to form the second dielectric region 32. Purely by way of example, the first process layer 32' may be made of $TiO_2$ and have a thickness of 200 nm.

Next, as illustrated in FIG. 14, a thermal annealing is carried out at a temperature of, for example, 1000° C., and with a duration of, for example, 90 s. The aforesaid annealing causes formation of the anode region 12.

Then, as illustrated in FIG. 15, a further photolithographic process is carried out, using a corresponding mask (not illustrated), so as to remove selectively a portion of the first process layer 32' and form the window F. The remaining portion of the first process layer 32' forms the second dielectric region 32.

Next, as illustrated in FIG. 16, a layer 44', referred to hereinafter as the second process layer 44', is formed by deposition. The second process layer 44' is made of non-doped polysilicon and is to form the resistive region 44. Purely by way of example, the second process layer 44' may have a thickness of 500 nm. Moreover, deposition of the polysilicon may be carried out at a temperature of approximately 600° C.

Figure 17:
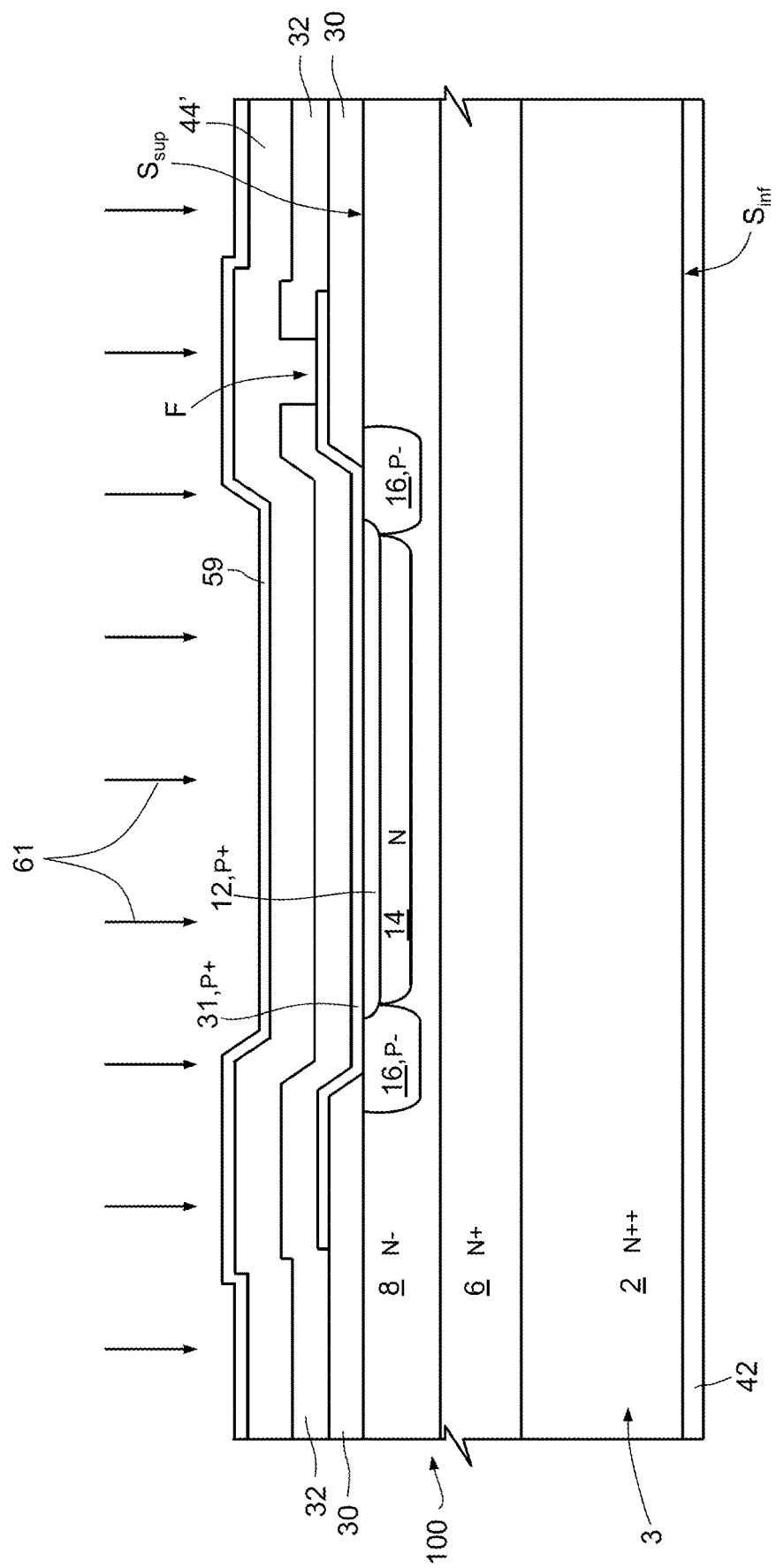

Then, as illustrated in FIG. 17, a further thermal annealing is carried out at a temperature of, for example, 950° C., and with a duration of, for example, 10 min. This annealing causes formation of an oxide layer 59 on the second process layer 44'. The oxide layer 59 has a thickness of, for example, 50 nm.

Next, as illustrated once again in FIG. 17, an ion implantation (indicated by the arrows 61) of dopant species of a P type (for example, boron) is carried out, with a doping of, for example, $1.4 \cdot 10^{14}$ cm$^{-2}$ and an energy of, for example, 50 keV. This implantation causes the second process layer 44' to acquire the doping level of the resistive region 44.

Figure 18:
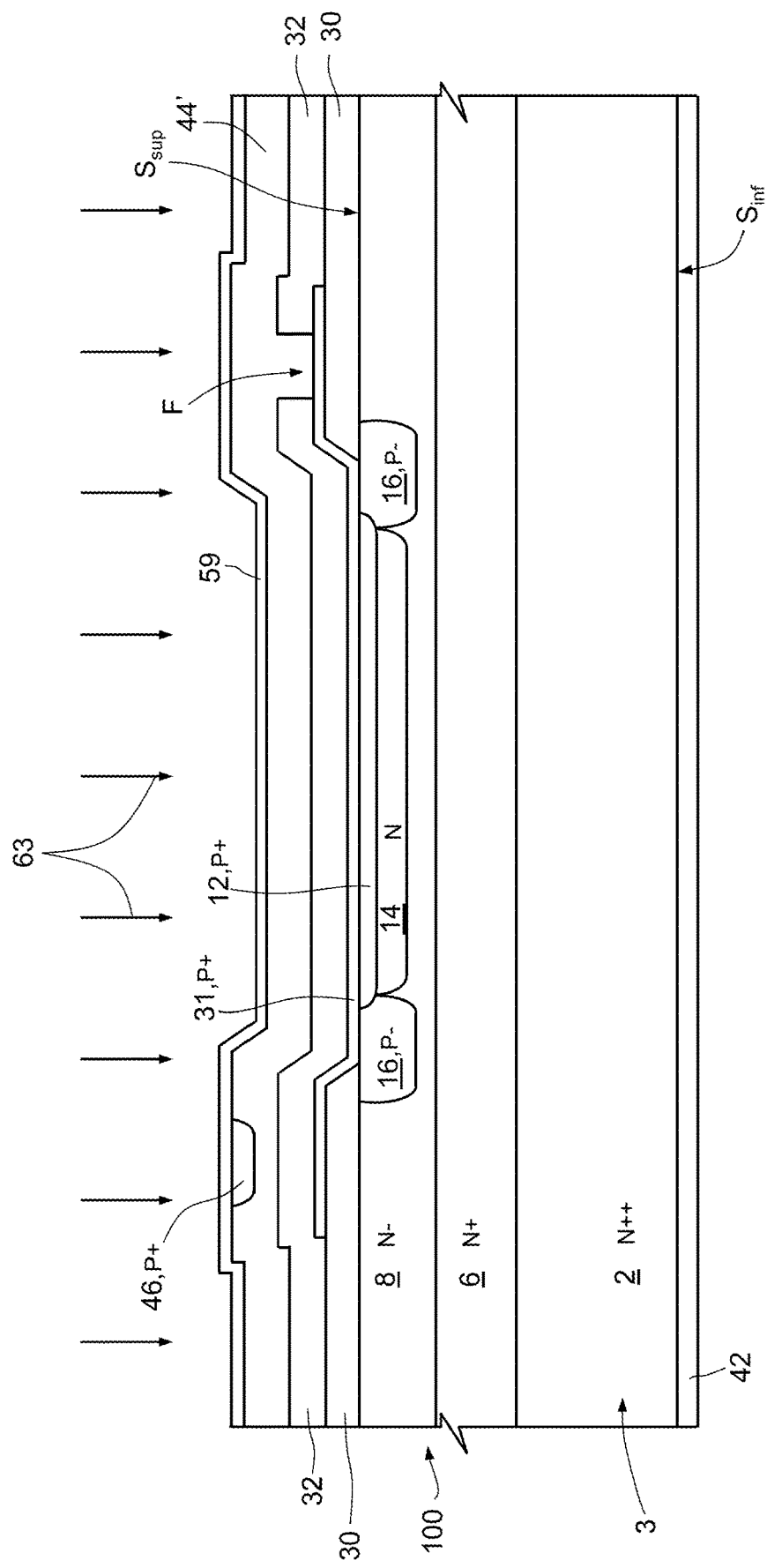

Then, as illustrated in FIG. 18, a process of selective ion implantation (indicated by the arrows 63) of dopant species of a P type (for example, boron) is carried out, with the aid of a corresponding mask (not illustrated), with a doping of, for example, $5 \cdot 10^{14}$ cm$^{-2}$ and an energy of, for example, 50 keV, so as to form the contact region 46. The mask is subsequently removed, and then a further thermal annealing is carried out in a nitrogen environment, at a temperature of, for example, 1000° C. and with a duration of, for example, half an hour.

Figure 19:
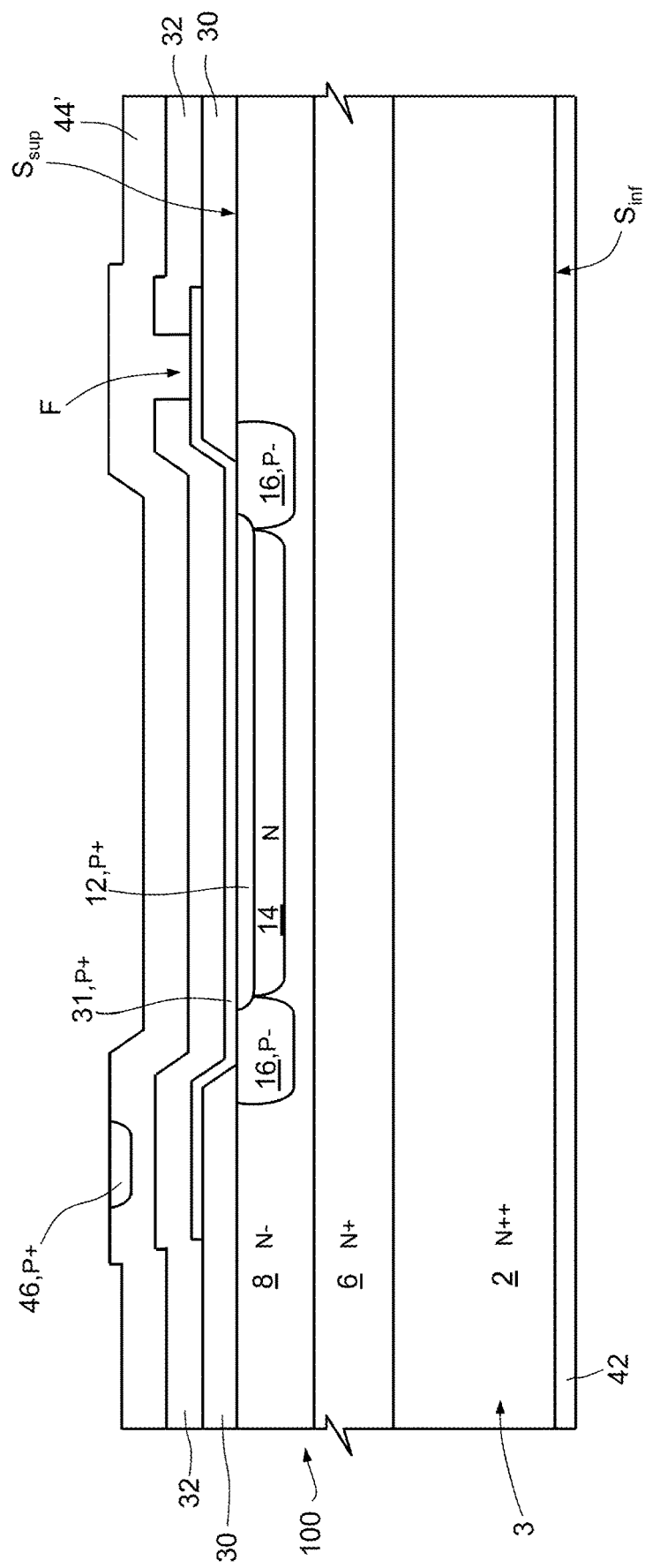

Next, as illustrated in FIG. 19, the oxide layer 59 is removed, for example by means of a wet etch.

Figure 20:
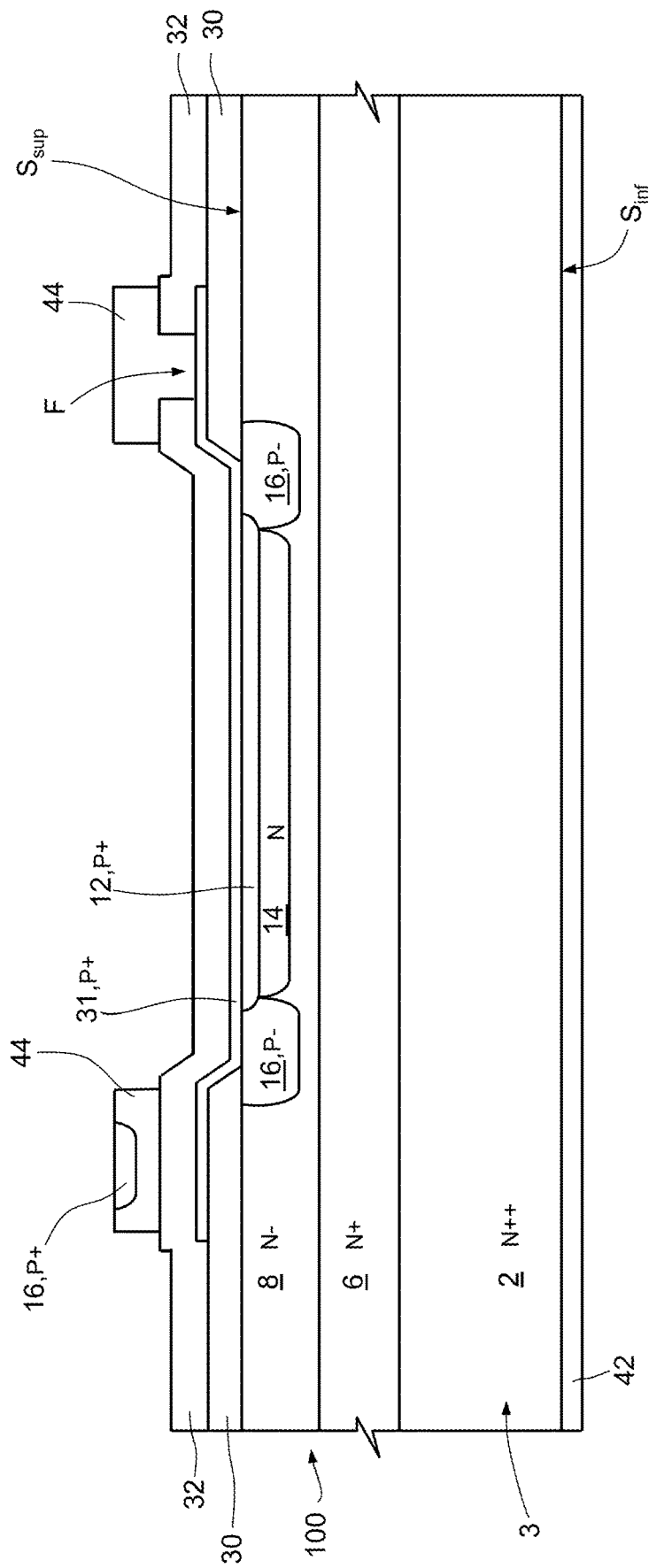

Then, as illustrated in FIG. 20, a further photolithographic process is carried out, using a corresponding mask (not illustrated), which enables selective removal of portions of the second process layer 44'. The remaining portion of the second process layer 44' forms the resistive region 44.

The detection device 1 is then completed in a way in itself known.

From what has been described and illustrated previously, the advantages that the present solution affords are evident.

In particular, the present device enables detection of the concentrations of one or more chemical species, with a high sensitivity, without having to resort to the use of a heater. In this connection, it has been found that the present detection device has a sensitivity in the region of 0.1%; it hence enables, for example, detection of a concentration of ammonia in the region of 5 ppm, in the case where the sensitive structure includes at least one nafion region.

In addition, the presence of a Geiger-mode diode enables amplification of the detection signal, without any need to resort to further integrated devices. Moreover, since the sensitive region is not traversed by current, effects of hysteresis are prevented, as well as deterioration of the performance of the detection device.

Finally, it is clear that modifications and variations may be made to what has been described and illustrated herein, without thereby departing from the sphere of protection of the present disclosure, as defined in the annexed claims.

As mentioned previously, the intermediate region 31 may be absent, as likewise the lateral-insulation region 24. Moreover, in the limit, it is possible for the die 100 to comprise just one detection device 1.

As regards the second dielectric region 32, it may be made of the same materials described previously, but of a porous or nanostructured type in order to increase sensitivity.

Also the manufacturing method may differ from what has been described. Purely by way of example, the anode region 12 may be formed by implantation instead of by diffusion.

Finally, all the types of doping may be reversed with respect to what has been described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for manufacturing a device for detecting a chemical species, comprising:
    forming a Geiger-mode avalanche diode in a body of semiconductor material delimited by a front surface, wherein forming the Geiger-mode avalanche diode includes:
        forming a cathode region having a first type of conductivity in the body and extending from the front surface; and
        forming an anode region having a second type of conductivity, which extends in the cathode region starting from the front surface;
    forming, on the anode region, a sensitive structure that includes a sensitive region, said sensitive region having an electrical permittivity that depends upon a concentration of said chemical species, a portion of the sensitive region directly overlying the anode region; and
    forming, on the sensitive structure, a resistive region electrically coupled to the anode region.

2. The method of claim 1, further comprising:
    forming, on the resistive region, a contact region electrically coupled to the resistive region.

3. The method of claim 2 wherein forming the resistive region includes forming the resistive region with an elongated shape with a first end and a second end, the first end being electrically coupled to the anode region, the second end being electrically coupled to the contact region.

4. The method of claim 1, further comprising:
    forming, between the anode region and the sensitive structure, an intermediate semiconductor region having the second type of conductivity, the intermediate semiconductor region being electrically interposed between the resistive region and the anode region.

5. The method of claim 4 wherein forming the anode region includes, after forming the cathode region, forming the intermediate semiconductor region.

6. The method of claim 1 wherein the sensitive region is made of a material chosen from a group consisting of: an oxide of a metal material, a non-conductive polymer, a carbon-based nanomaterial, and a polymer-metal compound.

7. The method of claim 1, further comprising:
    forming a precursor layer of metal material on the sensitive region, the precursor layer being configured to increase a chemical interaction between the sensitive region and the chemical species.

8. The method of claim 1, further comprising:
    forming a bottom metallization arranged underneath the body.

9. The method of claim 1 wherein the first type of conductivity is a conductivity of an N type, and the second type of conductivity is a conductivity of a P type.

10. A method, comprising:
    forming a cathode region of a first type of conductivity in a substrate, the cathode region extending from a surface of the substrate;
    forming an anode region of a second type of conductivity, the anode region extending in the cathode region from the surface of the substrate;
    forming a sensitive structure on the anode region, the sensitive structure including a sensitive region having an electrical permittivity that depends upon a concentration of a chemical species, a portion of the sensitive region directly overlying the anode region; and forming a resistive region on the sensitive structure, the resistive region being electrically coupled to the anode region.

11. The method of claim 10, further comprising:

forming a contact region that extends over and is electrically coupled to the resistive region, the resistive region having an elongated shape with a first end and a second end, the first end being electrically coupled to the anode region, the second end being electrically coupled to the contact region.

12. The method of claim 10, further comprising:

forming an intermediate semiconductor region having the second type of conductivity, the intermediate semiconductor region being interposed between the anode region and the sensitive structure, the resistive region being electrically coupled to the anode region through the intermediate semiconductor region.

13. The method of claim 10, further comprising:

forming a precursor layer of metal material on the sensitive region, the precursor layer being configured to increase a chemical interaction between the sensitive region and the chemical species.

14. The method of claim 10 wherein the sensitive region is made of a material chosen from a group consisting of: an oxide of a metal material, a non-conductive polymer, a carbon-based nanomaterial, and a polymer-metal compound.

15. The method of claim 10 wherein the first type of conductivity is a conductivity of an N type, and the second type of conductivity is a conductivity of a P type.

16. A method, comprising:

forming a cathode region in a substrate, the cathode region having a first type of conductivity;

forming an anode region that extends in to the cathode region, the anode region having a second type of conductivity;

forming a sensitive structure on the anode region, the sensitive structure including a sensitive region that is sensitive to a chemical species, a portion of the sensitive region directly overlying the anode region; and forming a resistive region on the sensitive structure, the resistive region being electrically coupled to the anode region, the anode region being positioned between first and second portions of the resistive region.

17. The method of claim 16 wherein the portion of the sensitive region is between the first and second portions of the resistive region.

18. The method of claim 16 wherein forming the resistive region includes forming the resistive region along three different sides of the anode region.

19. The method of claim 16, further comprising:

forming a precursor layer on the sensitive region, the precursor layer being configured to increase a chemical interaction between the sensitive region and the chemical species.

* * * * *